United States Patent
Jung et al.

(10) Patent No.: US 10,165,678 B2
(45) Date of Patent: Dec. 25, 2018

(54) BACKLIGHT UNIT INCLUDING CURVED LIGHT SOURCE UNIT AND DISPLAY APPARATUS HAVING THE SAME

(71) Applicant: Samsung Display Co., Ltd., Yongin-Si, Gyeonggi-Do (KR)

(72) Inventors: Minsu Jung, Asan-si (KR); Dong-wook Kim, Asan-si (KR); Jaesul An, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/450,188

(22) Filed: Mar. 6, 2017

(65) Prior Publication Data
US 2018/0092207 A1  Mar. 29, 2018

(30) Foreign Application Priority Data
Sep. 27, 2016 (KR) .................. 10-2016-0124273

(51) Int. Cl.
*F21V 8/00* (2006.01)
*H05K 1/02* (2006.01)
*H05K 1/18* (2006.01)
*H05K 7/02* (2006.01)

(52) U.S. Cl.
CPC .......... *H05K 1/0284* (2013.01); *G02B 6/009* (2013.01); *G02B 6/0068* (2013.01); *G02B 6/0083* (2013.01); *H05K 1/18* (2013.01); *H05K 7/02* (2013.01); *G02B 6/002* (2013.01); *G02B 6/0091* (2013.01); *H05K 2201/10121* (2013.01); *H05K 2201/10128* (2013.01)

(58) Field of Classification Search
CPC ........................ G02B 6/0083; H05K 1/0284
See application file for complete search history.

(56) References Cited

U.S. PATENT DOCUMENTS

| | | | |
|---|---|---|---|
| 8,950,926 B2 | 2/2015 | Kokusho | |
| 2002/0140880 A1* | 10/2002 | Weindorf | G02B 6/0023 349/70 |
| 2010/0290246 A1* | 11/2010 | Kim | G02B 6/002 362/602 |
| 2011/0199558 A1 | 8/2011 | Hamada | |

(Continued)

FOREIGN PATENT DOCUMENTS

| KR | 1020130037267 A | 4/2013 |
|---|---|---|
| KR | 101477425 B1 | 12/2014 |

(Continued)

*Primary Examiner* — Alexander Garlen
(74) *Attorney, Agent, or Firm* — Cantor Colburn LLP

(57) ABSTRACT

A display apparatus includes a display panel which displays an image with light and a backlight unit which provides the light to the display panel. The backlight unit includes a first light source, a second light source and a circuit board. The circuit board includes in a top plan view, a first edge lengthwise extending parallel to a first direction and a second edge lengthwise extending parallel to a second direction crossing the first direction, and a sidewall portion extending from the bottom portion. In a third direction crossing the first and second directions, the sidewall portion includes first and second sidewall portions respectively extending from the first and second edges, and on which the first and second light sources are mounted.

18 Claims, 6 Drawing Sheets

(56) References Cited

U.S. PATENT DOCUMENTS

| | | | |
|---|---|---|---|
| 2012/0057367 A1* | 3/2012 | Park | G02F 1/133603 362/606 |
| 2012/0182759 A1* | 7/2012 | Kokusho | G09F 13/0409 362/602 |
| 2012/0229728 A1* | 9/2012 | Kwon | G02B 6/0068 349/62 |
| 2012/0293721 A1 | 11/2012 | Ueyama | |
| 2013/0010233 A1 | 1/2013 | Seo et al. | |
| 2013/0039093 A1* | 2/2013 | Song | G02B 6/002 362/613 |
| 2013/0044508 A1* | 2/2013 | Bae | G02F 1/133615 362/602 |
| 2013/0077348 A1* | 3/2013 | Byun | F21S 8/00 362/613 |
| 2013/0128619 A1* | 5/2013 | Wang | G02F 1/133615 362/613 |
| 2015/0003064 A1 | 1/2015 | Choi et al. | |
| 2015/0092446 A1 | 4/2015 | Park et al. | |
| 2016/0011354 A1* | 1/2016 | Achi | G02B 6/002 362/608 |
| 2016/0062033 A1 | 3/2016 | Kim et al. | |

FOREIGN PATENT DOCUMENTS

| | | |
|---|---|---|
| KR | 101562097 B1 | 10/2015 |
| KR | 101574957 B1 | 12/2015 |
| KR | 1020160070893 A | 6/2016 |

* cited by examiner untitled# BACKLIGHT UNIT INCLUDING CURVED LIGHT SOURCE UNIT AND DISPLAY APPARATUS HAVING THE SAME This application claims priority to Korean Patent Application No. 10-2016-0124273, filed on Sep. 27, 2016, and all the benefits accruing therefrom under 35 U.S.C. § 119, the content of which in its entirety is herein incorporated by reference.

BACKGROUND

1. Field

The present disclosure relates to a backlight unit and a display apparatus having the same. More particularly, the present disclosure relates to a backlight unit capable of reducing or effectively preventing a dark area from occurring in a display area of a display apparatus and a display apparatus having the backlight unit.

2. Description of the Related Art

As a flat panel display device, various display devices, such as a liquid crystal display device, a plasma display panel, a field emission display device, a light emitting diode display device, an organic light emitting diode display device, etc., have been developed.

Among the display devices, the liquid crystal display device has been increasingly applied to various fields since it has advantageous properties, e.g., development in mass production technique, relative ease in driving, relatively low power consumption, relatively thin overall thickness, relatively high-definition display quality, use in forming a relatively large-sized display screen, etc.

The liquid crystal display device is not a self-emissive display device, and thus the liquid crystal display requires a light source separate from a display panel which generates an image with light from the light source. The liquid crystal display device includes a backlight unit which generates light and emits the light to the display panel. The backlight unit is classified into an edge-illumination type backlight unit and a direct-illumination type backlight unit according to the position of the light source within the backlight unit. In the edge-illumination type backlight unit, the light source is disposed at a side portion of the edge-illumination type backlight unit. In the direct-illumination type backlight unit, the light source is disposed under the display panel.

In the edge-illumination type backlight unit, the light source which generates light is accommodated in a side portion of a bottom chassis within the backlight unit. The edge-illumination type backlight unit includes a light guide plate receiving the light generated by the light source and uniformly providing the light to the display panel.

SUMMARY

One or more embodiment of the present disclosure provides a backlight unit which reduces or effectively prevents a dark area from occurring in a display area of a display apparatus in which the backlight unit is disposed, by maintaining a width of a bezel of the display apparatus having a curved boundary when viewed in a plan view.

One or more embodiment of the present disclosure provides a display apparatus including the backlight unit.

Embodiments of the invention provide a backlight unit including a first light source, a second light source, a circuit board and a bottom chassis. The circuit board includes a bottom portion and a sidewall portion.

The first light source may include a plurality of first light emitting diodes, and the second light source may include a plurality of second light emitting diodes. The number of the first light emitting diodes may be greater than the number of the second light emitting diodes. The first light source generates and emits a first light. The second light source generates and emits a second light.

The bottom portion includes in a top plan view, a first edge lengthwise extending parallel to a first direction and a second edge lengthwise extending parallel to a second direction crossing the first direction. An angle between the first edge and the second edge may be an obtuse angle.

The bottom portion may include a first bottom portion from which the first sidewall portion is extended; and a second bottom portion which extends from the first bottom portion at a first end thereof and from which the second sidewall portion is extended.

The first bottom portion may include the first edge of the bottom portion and forming a first corner in cross-section with the first sidewall portion extended therefrom, the first corner being lengthwise extended along the first edge in the top plan view, and the second bottom portion may include the second edge of the bottom portion and forming a second corner in cross-section with the second sidewall portion extended therefrom, the second corner being lengthwise extended along the second edge in the top plan view. The first bottom portion and the second bottom portion may be connected to each other in a same plane.

The sidewall portion includes a first sidewall portion extending from the first edge of the bottom portion and on which the first light source is mounted and a second sidewall portion extending from the second edge of the bottom portion and on which the second light source is mounted. At a boundary between the first and second edges of the bottom portion, the first and second sidewall portions may be separated from each other.

The third direction may be perpendicular to the first and second directions. The first sidewall portion may extend in the third direction from the first edge of the bottom portion to form a first corner in cross-section which is lengthwise extended along the first edge in the top plan view, and the second sidewall portion may extend in the third direction from the second edge of the bottom portion to form a second corner in cross-section which is lengthwise extended along the second edge in the top plan view.

The backlight unit may further include a third light source which generates and emits a third light with which the display panel generates and displays the image. In the top plan view, the bottom portion may further include a third bottom portion which extends from the first bottom portion at a second end thereof opposite to the first end to dispose the first bottom portion between the second and third bottom portions in the top plan view. The third bottom portion may include a third edge of the bottom portion, the third edge lengthwise extending parallel to a fourth direction crossing each of the first and second directions and in the same plane thereof. The sidewall portion may further include a third sidewall portion extending in the third direction from the third edge of the bottom portion.

In the top plan view, lengths of the first, second and third sidewall portions may respectively extend in length extension directions parallel to the first, second and fourth directions crossing each other. An angle between the length extension directions of the first sidewall portion and the second sidewall portion is equal to an angle between the length extension directions the first sidewall portion and the third sidewall portion.

The backlight unit may further in include a fourth light source and a fifth light source which respectively generate and emit a fourth light and a fifth light with which the display panel generates and displays the image. The bottom portion may further include a fourth bottom portion which extends from an end of the second bottom portion opposite that from which the first bottom portion extends to dispose the second bottom portion between the first bottom portion and the fourth bottom portion, the fourth bottom portion including a fourth edge of the bottom portion, the fourth edge lengthwise extending parallel to a fifth direction crossing each of the first, second and fourth directions and in the same plane thereof; and a fifth bottom portion which extends from an end of the third bottom portion opposite to that from which the first bottom portion extends to dispose the third bottom portion between the first bottom portion and the fifth bottom portion, the fifth bottom portion including a fifth edge of the bottom portion, the fifth edge lengthwise extending parallel to a sixth direction crossing each of the first, second, fourth and fifth directions and in the same plane thereof. The sidewall portion may further include a fourth sidewall portion extending in the third direction from the fourth edge of the bottom portion and on which the fourth light source is mounted; and a fifth sidewall portion extending in the third direction from the fifth edge of the bottom portion and on which the fifth light source is mounted.

The circuit board may further include a first wiring line and a second wiring line. The first wiring line may be electrically connected to the first light source. The second wiring line may be electrically connected to the second light source.

A portion of the first wiring line and a portion of the second wiring line may be provided on the bottom portion. The first and second sidewall portions may extend in the third direction respectively from the first and second edges of the bottom portion to form first and second corners in cross-section which are lengthwise extended along the first and second edges in the top plan view.

The first wiring line may include a first bending wiring line portion overlapped with the first corner, and the second wiring line includes a second bending wiring line portion overlapped with the second corner. The first bending wiring line portion may have a line width greater than a line width of the portion of the first wiring line disposed on the bottom portion, and the second bending wiring line portion may have a line width greater than a line width of the portion of the second wiring line disposed on the bottom portion A portion of the first wiring line may be disposed on the bottom portion, and a portion of the second wiring line may be disposed on the second sidewall portion. The first wiring line may include a first bending wiring line portion overlapped with the first corner. The first bending wiring line portion may have a line width greater than a line width of the portion of the first wiring line disposed on the bottom portion.

The backlight unit may further include an extrusion bar and a light guide plate. The extrusion bar may be disposed between the bottom portion and the bottom chassis and commonly disposed at each of the first and second sidewall portions. The light guide plate may include a first light incident surface and a second light incident surface. The first light emitted from the first light source may be incident to the first incident surface. The second light emitted from the second light source may be incident to the second incident surface. The first incident surface may lengthwise extend in the first direction, and the second incident surface may lengthwise extend in the second direction from an end of the first incident surface.

Embodiments of the invention provide a display apparatus including a display panel and a backlight unit providing a light to the display panel.

The display panel includes a display area at which an image is generated and displayed with light and a non-display area which is disposed adjacent to the display area and at which the image is not displayed. A portion of an outer boundary of the display panel may have a curved line shape in the top plan view. A portion of an inner boundary between the display area and the non-display area may have a curved line shape in the top plan view. In the top plan view, the non-display area may include a first area lengthwise extending in the first direction and a second area lengthwise extending from the first area and including the inner boundary having the curved line shape between the display area and the non-display area.

The backlight unit includes a first light source, a second light source, a circuit board and a bottom chassis. In the top plan view, the circuit board which is accommodated in the bottom chassis may overlap the non-display area and have a shape corresponding to the curved line shape of the inner boundary defined between the display area and the non-display area. In the top plan view, the circuit board includes a bottom portion including a first edge lengthwise extending parallel to a first direction and a second edge lengthwise extending parallel to a second direction crossing the first direction, and a sidewall portion extending in a thickness direction of the display apparatus from the bottom portion. The sidewall portion includes a first sidewall portion and a second sidewall portion. The first sidewall portion is bent at the first edge from the bottom portion with respect to a bending axis parallel to the first direction. The second sidewall portion is bent at the second edge from the bottom portion with respect to a bending axis parallel to the second direction. The first light source is mounted on the first sidewall portion, and the second light source is mounted on the second sidewall portion.

The circuit board may be overlapped with the non-display area in the top plan view. The non-display area may include a first area lengthwise extending in the first direction; and a second area lengthwise extending from the first area and including the inner boundary having the curved line shape between the display area and the non-display area. The first sidewall portion may be overlapped with the first area in the top plan view, and the second sidewall portion may be overlapped with the second area in the top plan view.

According to one or more embodiment of a backlight unit and display apparatus according to the invention, the light sources are respectively mounted on the sidewall portions of the circuit board, which lengthwise extend in different directions from each other. Thus, a dark area may be reduced or effectively prevented without expanding a width of the bezel of the display apparatus.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
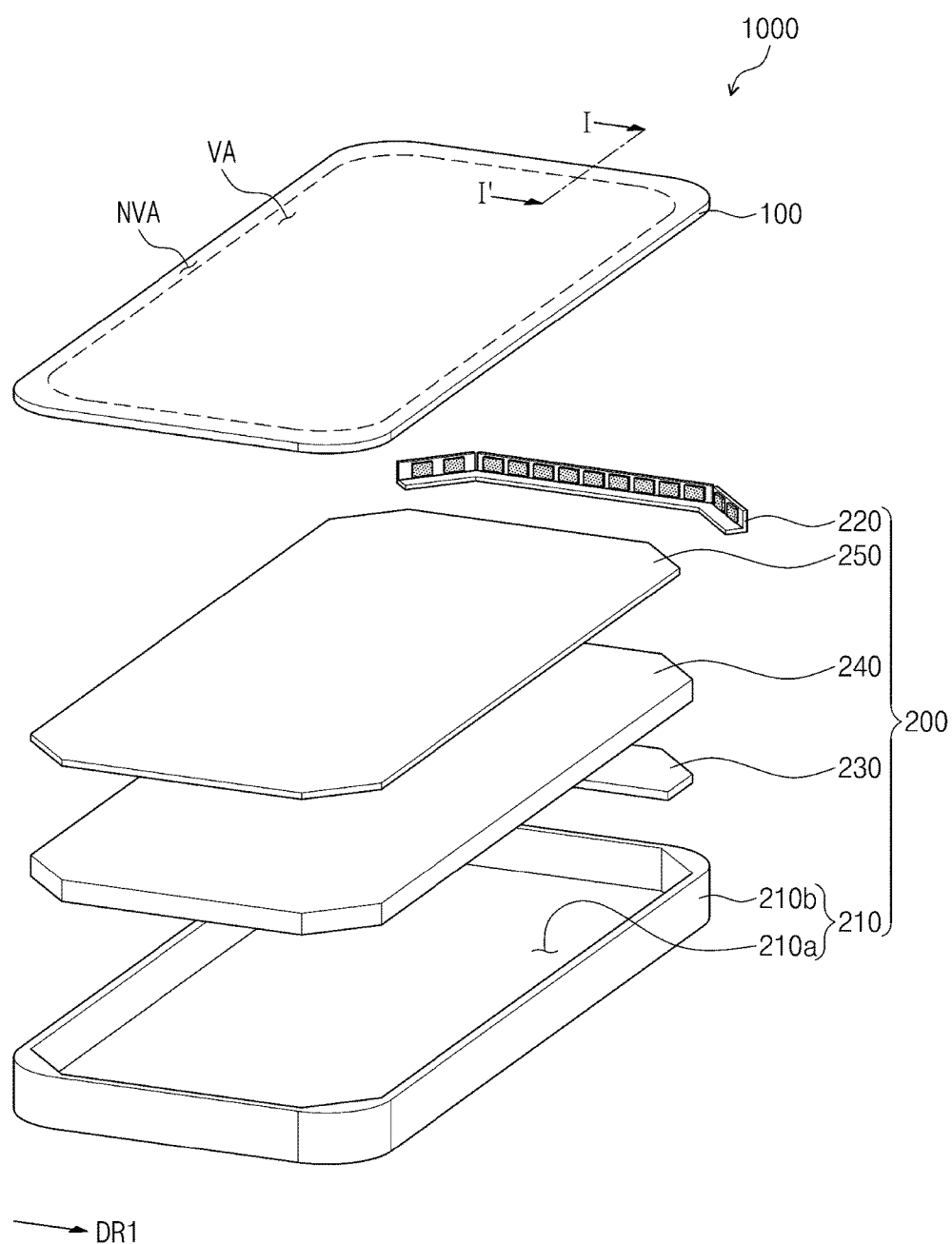
FIG. 1 is an exploded perspective view showing an exemplary embodiment of a display apparatus according to the invention.

Hereinafter, the invention will be explained in detail with reference to the accompanying drawings. However, the invention should not be limited to specific embodiments, and accordingly, those of ordinary skill in the art will recognize that various changes, equivalents, and modifications of the various embodiments described herein can be made without departing from the scope and spirit of the present disclosure. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ± 30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

Figure 2:
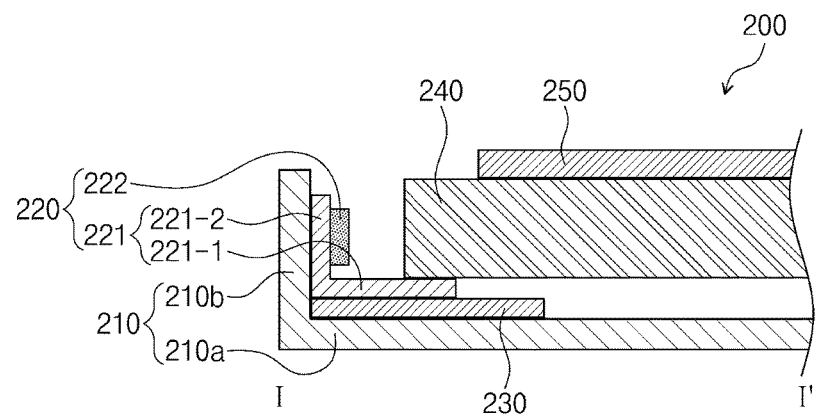
FIG. 2 is a cross-sectional view of an exemplary embodiment of a backlight unit in the display apparatus taken along line I-I' of FIG. 1.

FIG. 1 is an exploded perspective view showing an exemplary embodiment of a display apparatus 1000 according to the invention. FIG. 2 is a cross-sectional view of an exemplary embodiment of a backlight unit 200 of a display apparatus taken along line I-I' of FIG. 1.

Referring to FIG. 1, the display apparatus 1000 includes a display panel 100 and the backlight unit 200. In the top plan view, an exemplary embodiment of a boundary of the display panel 100 and/or the display apparatus 1000 may be formed by straight line (e.g., linear) portions and curved line portions.

The display panel 100 generates and displays an image with light. The display panel 100, which is not a self-emissive display panel, e.g., an organic light emitting display panel, may be a non-self-emissive display panel displaying the image using a surrounding light. In an exemplary embodiment, for instance, the display panel 100 may be one of a liquid crystal display panel, an electrophoretic display panel, and an electrowetting display panel. Hereinafter, the liquid crystal display panel will be described as the display panel 100.

The display panel 100 includes a display area VA at which the image is displayed and a non-display area NVA which surrounds the display area VA. The image is not displayed in the non-display area NVA. The display area VA and the non-display area NVA may collectively define a whole of the display panel 100 in a top plan view. In the top plan view, the non-display area NVA corresponds to a bezel area of the display apparatus 1000.

The display panel 100 may include a curved line portion when viewed in the top plan view as a portion of an outer boundary and/or an inner boundary thereof. In detail, the outer boundary (e.g., outer edge of the display panel 100) of the non-display area NVA may include the curved line when viewed in the top plan view. In an exemplary embodiment, the portion of the outer boundary of the non-display area NVA may be provided in a rounded shape having a predetermined curvature to prevent a vertex (e.g., where two linear portions meet) from being generated.

The inner boundary at which the display and non-display areas VA and NVA meet distinguishes the display area VA from the non-display area NVA and may include a curved line. A portion of the inner boundary between the display area VA and the non-display area NVA may be provided in a rounded shape having a predetermined curvature to prevent a vertex (e.g., where two linear portions meet) from being generated. While both the inner and outer boundaries of the display panel 100 are shown formed by a curved line, the invention is not limited thereto.

Although not show, the display panel 100 may include an upper substrate and a lower substrate facing each other. Each of the upper and lower substrates may include a display area and a non-display area corresponding to those of the overall display panel 100 described above. In an exemplary embodiment, the lower substrate includes gate lines which transmit gate or control signals, data lines which transmit data or control signals thin film transistors connected to the gate lines and data lines, and pixel electrodes connected to the thin film transistors, each on a lower base substrate. The gate lines are insulated from the data lines while crossing the data lines in the top plan view. Each thin film transistor may be a three-terminal device connected to one gate line, one data line and one pixel electrode. A data voltage applied to a corresponding data line of the data lines is applied to a corresponding pixel electrode of the pixel electrodes in response to a signal applied to a corresponding gate line of the gate lines, so as to generate the image of the display panel 100 in cooperation with other elements or layers within the display panel 100.

The upper substrate is disposed above the lower substrate. The lower substrate is disposed to face the upper substrate such that an optical medium layer such as a liquid crystal layer including a plurality of liquid crystal molecules is disposed between the lower substrate and the upper substrate.

The lower substrate may further include a color filter and a common electrode on the lower base substrate, but the color filter and the common electrode may be disposed on an upper base substrate within the upper substrate according to other embodiments. The display apparatus 1000 may further include a pair of polarizing plates respectively disposed on upper and lower portions of the display panel 100.

The backlight unit 200 is disposed under the display panel 100 to generate light and provide the generated light to the display panel 100. Referring to FIGS. 1 and 2, the backlight unit 200 includes a bottom chassis 210, a light source unit 220, an extrusion bar or extruded bar 230, a light guide plate 240 and an optical sheet 250.

The bottom chassis 210 includes a bottom portion 210 hereinafter referred to as a bottom surface 210a and a sidewall 210b which extends from an edge of the bottom surface 210a. The sidewall 210b may be formed of multiple sidewall portions each extended from the edge of the bottom surface 210a at respective sides of the bottom chassis 210. The bottom chassis 210 includes an accommodating space defined by the bottom surface 210a in cooperation with the sidewall 210b. The light source unit 220, the extrusion bar 230, the light guide plate 240 and the optical sheet 250 are accommodated in the accommodating space. Although not shown in figures, a mold frame may further be disposed above the bottom chassis 210 to support the display panel 100 thereon.

The sidewall 210b includes an inner side surface at the accommodating space to define the accommodating space in cooperation with the bottom surface 210a. The inner side surface may have an overall angled shape to support a sidewall portion 221-2 of the light source unit 220. The sidewall 210b includes an outer side surface opposite to the inner side surface and facing away from the accommodating space. In a top plan view, the outer side surface may include a curved surface corresponding to the outer shape of the display panel 100, but should not be limited thereto or thereby.

The light source unit 220 generates and emits the light in response to a power source voltage and the emitted light is provided to the display panel 100 such as via other elements of the backlight unit 200. The light source unit 220 includes a circuit board 221 and a light source 222. Referring to FIG. 2, the circuit board 221 includes a bottom portion 221-1 and the sidewall portion 221-2 which extends from the bottom portion 221-1.

The circuit board 221 is disposed on the bottom surface 210a of the bottom chassis 210. The sidewall 210b of the bottom chassis 210 surrounds the circuit board 221 in the top plan view. The light source unit 220 has an edge structure, and thus the circuit board 221 is placed to correspond to the sidewall 210b of the bottom chassis 210. The sidewall portion 221-2 of the circuit board 221 makes contact with the sidewall 210b of the bottom chassis 210. The circuit board 221 has a specific shape, especially in the top plan view, to effectively provide the light to the display panel 100 having the rounded shape at portions thereof. The circuit board 221 will be described in detail later.

The light source 222 is mounted on the sidewall portion 221-2 of the circuit board. In the exemplary embodiment, at least one light source 222 is provided, and the light source 222 and receives the power source voltage from the circuit board 221 to generate and emit the light. The light source 222 may be provided in plurality on the circuit board 221 along a length thereof. The light source 222 may be, but not limited to, a light emitting diode ("LED"). The circuit board 221 receives the power source voltage used to drive the light source 222 from an external source (not shown) and provides the power source voltage to the light source 222 which generates and emits the light with the power source voltage.

In the exemplary embodiment, the light emitting diode will be described as the light source 222, but in other embodiments the light source 222 may be a cold cathode fluorescent lamp ("CCFL") or a flat fluorescent lamp ("FFL").

The extrusion bar 230 is disposed between the bottom surface 210a of the bottom chassis 210 and the light source unit 220. In detail, the extrusion bar 230 is disposed between the bottom surface 210a of the bottom chassis 210 and the bottom portion 221-1 of the circuit board 210 to fix the light source unit 220 within the bottom chassis 210. The extrusion bar 230 discharges a heat generated from the light source unit 220, such as in a direction away from the light source unit 220 and other elements of the backlight unit 200. The extrusion bar 230 may be manufactured with or include a conductive material such as metal material having superior heat conductivity, e.g., aluminum, an aluminum alloy, etc.

In the top plan view, the extrusion bar 230 may be disposed on the bottom surface 210a of the bottom chassis 210 to correspond to the sidewall 210b of the bottom chassis 210. In an exemplary embodiment of a method of manufacturing a backlight unit, the extrusion bar 230 may be manufactured by forming a planar quadrangular-shaped plate having vertex areas at corners thereof through an extrusion method. The original quadrangular-shape of the extrusion bar 230 may be cut or re-shaped at the vertex areas to omit linear portions meeting each other such that the modified extrusion bar 230 may have a planar shape corresponding to the bottom chassis 210 (e.g., within the sidewall 210b). In this case, since the extrusion bar 230 is manufactured through a simplified manufacturing method, the mass production of the extrusion bar 230 may be obtained.

However, according to embodiments, the extrusion bar 230 may be manufactured by various ways, e.g., a plate method, a casting method, etc. In addition, the extrusion bar 230 disposed on the bottom surface 210a may be extended in a thickness direction of the backlight unit 200 to be disposed between the sidewall 210b of the bottom chassis 210 and the sidewall 221-2 of the circuit board 221 to support the sidewall 221-2 of the circuit board 221 thereon.

The light guide plate 240 may be disposed in the accommodating space. The light guide plate 240 may be disposed on the bottom surface 210a of the bottom chassis 210 and on the extrusion bar 230. In addition, the light guide plate 240 may be disposed on the bottom portion 221-1 of the circuit board 221. A step may be respectively formed between the bottom portion 221-1 of the circuit board 221, the extrusion bar 230 and the bottom surface 210a of the bottom chassis 210. In this case, a step-difference compensation layer (not shown) may be provided between the light guide plate 240 and the extrusion bar 230 and/or between the light guide plate 240 and the bottom surface 210a of the bottom chassis 210 to support the light guide plate 240 disposed on these elements. However, according to other embodiments, the light guide plate 240 may be disposed to directly make contact with the extrusion bar 230 and/or the bottom surface 210a of the bottom chassis 210.

The light emitted from the light source unit 220 is incident to the light guide plate 240 at a light incident (side) surface thereof. The incident light is guided within the light guide plate 240 by the light guide plate 240 and exits from the light guide plate 240 to travel to the display panel 100. The light exit surface of the light guide plate 240 faces the optical sheet 250 and the display panel 100. A rear surface of the light guide plate 240 is opposite to the light exit surface thereof, and side surfaces connect the rear and light exit surfaces to each other. The light guide plate 240 may be disposed to correspond to the sidewall 210b of the bottom chassis 210. The light guide plate 240 may be disposed to allow a side surface thereof to correspond to the light source unit 220 as the light incident surface.

The optical sheet 250 is disposed above the light guide plate 240 to improve an efficiency of the light exiting from the light guide plate 240. The optical sheet 250 collectively includes at least one of a diffusion sheet, a light condensing sheet and a protective sheet. The diffusion sheet diffuses the light exiting from the light guide plate 240. The light condensing sheet enhances a brightness of the light diffused by the diffusion sheet. The protective sheet protects the light condensing sheet and obtains a viewing angle.

Although not shown in figures, the backlight unit 200 may further include a reflective sheet (not shown) disposed under the light guide plate 240 at the rear surface thereof. The reflective sheet reflects a light leaking downward from the light guide plate 240 through the rear surface thereof to be incident to the light guide plate 240 again.

Figure 3:
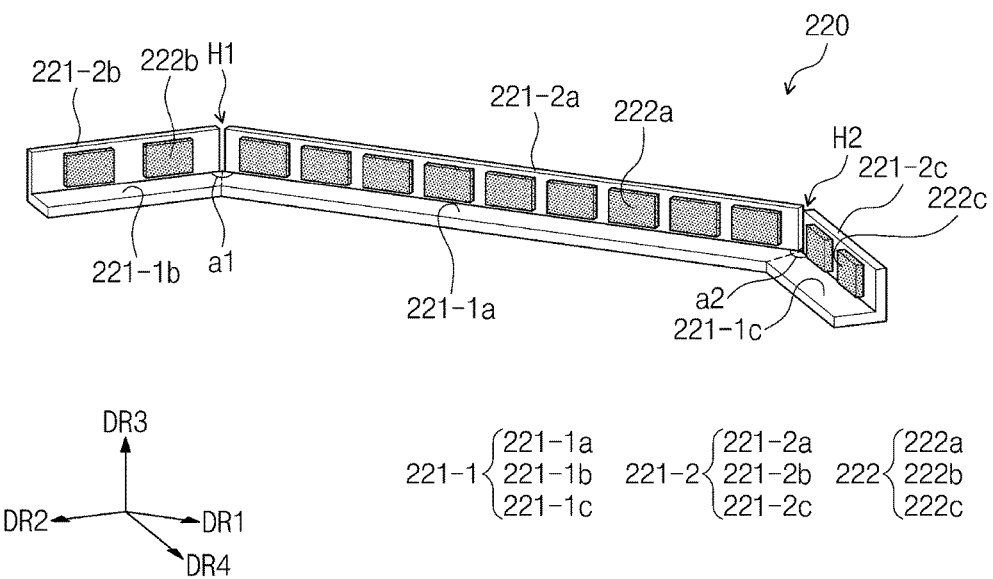
FIG. 3 is a perspective view showing an exemplary embodiment of a light source unit of a backlight unit according to the invention.
Figure 4:
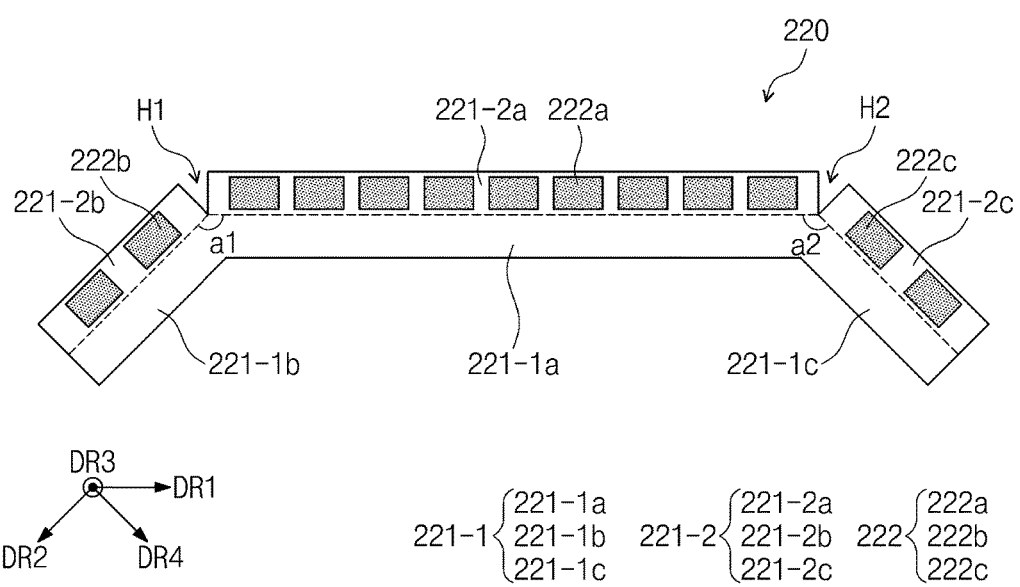
FIG. 4 is a top plan view showing the light source unit of FIG. 3 in a flat state thereof.

FIG. 3 is a perspective view showing an exemplary embodiment of the light source unit 220 of a backlight unit according to the invention. FIG. 4 is a top plan view showing the light source unit 220 of FIG. 3 in a flat state thereof.

Referring to FIG. 3, the light source unit 220 includes the circuit board 221 and the light source 222, and the circuit board 221 includes the bottom portion 221-1 and the sidewall portion 221-2. The bottom portion 221-1 collectively includes a first bottom portion 221-1a, a second bottom portion 221-2a and a third bottom portion 221-1c. The sidewall portion 221-2 collectively includes a first sidewall portion 221-2a, a second sidewall portion 221-2b and a third sidewall portion 221-2c. Referring to FIGS. 1-3, the extrusion bar 320 commonly overlaps each of the first to third bottom portions 221-1a, 221-1b and 221-1c.

The light source 222 is provided in plurality and includes a first light source 222a, a second light source 222b and a third light source 222c. One or more of the first light source 222a, the second light source 222b and the third light source 222c may be provided in plurality relating respectively to the first sidewall portion 221-2a, the second sidewall portion 221-2b and the third sidewall portion 221-2c.

Each of the first bottom portion 221-1a, the second bottom portion 221-2a and the third bottom portion 221-1c defines a length thereof extended in a line. In a top plan view, the lengths (or lines) of a respective bottom portion may virtually extend to intersect the length (or line) of another bottom portion. Similarly each of the first sidewall portion 221-2a, the second sidewall portion 221-2b and the third sidewall portion 221-2c defines a length thereof extended in a line. In the top plan view, the lengths (or lines) of a respective sidewall portions may virtually extend to intersect the length (or line) of another sidewall portion. In the top plan view, a respective pair of bottom and sidewall portions meet at the line of the lengths thereof. That is, in the top plan view, the lengths of the pair of bottom and sidewall portions may be parallel to each other.

Hereinafter, a length direction of the line at which the first bottom portion 221-1a intersects with the first sidewall portion 221-2a is referred to as a first direction DR1. A length direction of the line at which the second bottom portion 221-1b intersects with the second sidewall portion 221-2b is referred to as a second direction DR2. A direction in which the first sidewall portion 221-2a extends from the first bottom portion 221-1a, a direction in which the second sidewall portion 221-2b extends from the second bottom portion 221-1b and/or or a direction in which the third sidewall portion 221-2c extends from the third bottom portion 221-1c is referred to as a third direction DR3 (otherwise referred to as a thickness direction). A length direction of a line at which the third bottom portion 221-1c intersects with the third sidewall portion 221-2c is referred to as a fourth direction DR4.

The first, second and fourth directions DR1, DR2 and DR4 may be disposed in a same plane defined by two or more of these directions. In FIG. 4, the respective sidewall portions which extend from respective bottom portions in the third direction DR3 are illustrated in the same plane as that of the bottom portions for purposes of explanation. The display apparatus 1000 and components thereof may be disposed in a plane parallel to that defined by the first, second and fourth directions DR1, DR2 and DR4. In the top plan view, an angle between the first direction DR1 and the second direction DR2 is referred to as a first angle a1, and an angle between the first direction DR1 and the third direction DR3 is referred to as a second angle a2.

Each of the bottom portions respectively defines opposing ends thereof (dotted lines in FIG. 3 between adjacent bottom portions) in the length direction thereof. At the opposing ends thereof, each bottom portion has a side surface or side portion extended in the thickness direction (e.g., DR3). Side portions of adjacent bottom portions face each other (e.g., at the dotted lines in FIG. 3). The bottom portions may be connected to each other at the side portions thereof. A first side portion of the first bottom portion 221-1a is connected to a side portion of the second bottom portion 221-1b, and a second side portion which is opposite to the first side portion in a length direction of the first bottom portion 221-1a is connected to a side portion of the third bottom portion 221-1c. As discussed above, the first bottom portion 221-1a, the second bottom portion 221-1b and the third bottom portion 221-1c are disposed in a same plane. In an exemplary embodiment, upper and/or lower surfaces of the same-plane first to third bottom portions 221-1a, 221-1b and 221-1c may be disposed in a same plane but not being limited thereto.

A long side (e.g., length) of the first bottom portion 221-1a extends in the first direction DR1. A long side (e.g., length) of the second bottom portion 221-1b extends in the second direction DR2 from the first side portion of the first bottom portion 221-1a. The length extension direction of the first bottom portion 221-1a and the length extension direction of the second bottom portion 221-1b form the first angle a1. A long side (e.g., length) of the third bottom portion 221-1c extends in the fourth direction DR4 from the second side portion the first bottom portion 221-1a. The length extension direction of the first bottom portion 221-1a and the length extension direction of the third bottom portion 221-1c form the second angle a2. The first angle a1 may be equal to the second angle a2, but should not be limited thereto or thereby.

The first sidewall portion 221-2a extends in the third direction DR3 from the first bottom portion 221-1a. An angle between the first direction DR1 and the third direction DR3 may be about 90 degrees. The second sidewall portion 221-2b extends in the third direction DR3 from the second bottom portion 221-1b. An angle between the second direction DR2 and the third direction DR3 may be about 90 degrees. The third sidewall portion 221-2c extends in the third direction DR3 from the third bottom portion 221-1c. An angle between the third direction DR3 and the fourth direction DR4 may be about 90 degrees. Referring to FIG. 2, in cross-section, a respective bottom and sidewall portion meet each other to form a corner (e.g., a corner is formed by the bottom portion 221-1 and the sidewall portion 221-2) extended from each other. In the top plan view, the line at which a respective bottom and sidewall portion meet each other may represent an extension of the corner formed in cross-section.

The intersection line between the first bottom portion 221-1a and the first sidewall portion 221-2a is referred to as a first corner. A side of the display apparatus 1000 facing the first corner is formed to be substantially parallel to the first direction DR1. The intersection line between the second bottom portion 221-1b and the second sidewall portion 221-2b is referred to as a second corner. A side of the display apparatus 1000 facing the second corner is formed to be substantially parallel to the second direction DR2. The intersection line between the third bottom portion 221-1c and the third sidewall portion 221-2c is referred to as a third corner. A side of the display apparatus 1000 facing the third corner is formed to be substantially parallel to the fourth direction DR4. However, the first bottom portion 221-1a, the second bottom portion 221-1b and the third bottom portion 221-1c may have various shapes within the same surface according to other embodiments.

The light source unit 220 in single plane (FIG. 4) or in multiple planes (FIG. 3) includes a first slit H1 provided between the first sidewall portion 221-2a and the second sidewall portion 221-2b where these sidewall portions are disconnected from each other. The first sidewall portion 221-2a and the second sidewall portion 221-2b are separated from each other by the first slit H1. A shape of the first slit H1 should not be limited to a specific shape such as taken in the top plan view as long as the first sidewall portion 221-2a and the second sidewall portion 221-2b are not overlapped with each other when the first sidewall portion 221-2a and the second sidewall portion 221-2b are accommodated in the bottom chassis 210 (e.g., in the multiple-plane shape of FIG. 3). In an exemplary embodiment, for instance, the first slit H1 may have a wedge shape (FIG. 3) or a quadrangular shape.

Similarly, a second slit H2 is provided between the first sidewall portion 221-2a and the third sidewall portion 221-2c. The first sidewall portion 221-2a and the third sidewall portion 221-2c are separated from each other by the second slit H2. A shape of the second slit H2 should not be limited to a specific shape as long as the first sidewall portion 221-2a and the third sidewall portion 221-2c are not overlapped with each other when the first sidewall portion 221-2a and the third sidewall portion 221-2c are accommodated in the bottom chassis 210. In an exemplary embodiment, for instance, the second slit H2 may have a wedge shape or a quadrangular shape that is the same as that of the first slit H1.

An angle between a length extension of the first sidewall portion 221-2a and the length extension of the second sidewall portion 221-2b forms the first angle a1. An angle between the length extension of first sidewall portion 221-2a and the third sidewall portion 221-2c forms the second angle a2. The first angle a1 and the second angle a2 may be the same as each other. The first angle a1 and the second angle a2 may be equal to or greater than a certain value. The certain value may be defined such that the light source 222 mounted on the sidewall portion 221-2 provides the light to the edge of the display area VA. Each of the first and second angles a1 and a2 may be, but not limited to, an obtuse angle.

The first light source 222a is mounted on the first sidewall portion 221-2a. The light emitted from the first light source 222a travels in a direction substantially vertical (e.g., perpendicular or normal) to a surface or plane defined by the first direction DR1 and the third direction DR3. The second light source 222b is mounted on the second sidewall portion 221-2b. The light emitted from the second light source 222b travels in a direction substantially vertical to a surface defined by the second direction DR2 and the third direction DR3. The third light source 222c is mounted on the third sidewall portion 221-2c. The light emitted from the third light source 222c travels in a direction substantially vertical to a surface defined by the third direction DR3 and the fourth direction DR4.

The first light source 222a may be provided in plurality to form a plurality of first light emitting diodes 222a as shown in FIG. 3 and FIG. 4. Similarly, the second light source 222b may be provided in plurality to form a plurality of second light emitting diodes 222b. The third light source 222c may be provided in plurality to form a plurality of third light emitting diodes 222c. The number of the first light emitting diodes may be greater than the number of the second light emitting diodes and/or the number of the third light emitting diodes. The number of the second light emitting diodes may be equal to the number of the third light emitting diodes.

In a conventional display apparatus where the boundary of a display panel includes the curved line (refer to that of the display apparatus 1000 of FIG. 1), the non-display area of the convention display apparatus becomes larger when the light source unit is not bent or formed to have a corresponding curved profile, and thus implementing a relatively narrow bezel area of the conventional display apparatus may be difficult. That is, where that a first angle (refer to a1 of FIGS. 3 and 4) between first and second sidewall portions (refer to 221-2a and 221-2b of FIGS. 3 and 4) is about 180 degrees, forming a curved line boundary of the display panel 100 (refer to FIG. 1) is difficult. In addition, in the conventional display apparatus where the second and third sidewall portions (refer to 221-2b and 221-2c of FIGS. 3 and 4) are removed in the conventional display apparatus, the bezel area of thereof may become narrower, but a dark area may occur at the boundary area of the display area (refer to VA of FIG. 1).

In contrast, according to one or more exemplary embodiment of the invention, the second and third light sources 222b and 222c are respectively disposed on the second and third sidewall portions 221-2b and 221-2c forming the first and second angles a1 and a2, and as a result, the display apparatus 1000 of the invention may advantageously have the relatively narrow bezel area, and the dark area of the display area VA may be reduced.

In a conventional backlight unit, the first, second and third light sources (refer to 222a, 222b and 222c of FIGS. 3 and 4) are mounted on the first, second and third bottom portions (refer to 221-1a, 221-1b and 221-1c. However, a contact area between the light sources and the bottom portion when the light source is mounted on the bottom portion is smaller than a contact area between the light source and the sidewall portion (refer to 221-2 of FIGS. 3 and 4) when the light source is mounted on the sidewall portion. Accordingly, in the conventional backlight unit where the light source is mounted on the bottom portion, the light source may fall off by external impacts applied thereto. In addition, in the conventional backlight unit where the light source is mounted on the bottom portion, the heat discharge efficiency is lowered due to the relatively small contact area.

In contrast, according to one or more exemplary embodiment of the invention where the light source 222 is mounted on the sidewall portion 221-2, stability, reliability and heat discharge characteristics of the light source unit 220 may be improved.

In conventional backlight unit, the bottom portion (refer to 221-1 om FIG. 2) of the light source unit may be removed such that the first sidewall portion is connected to the second sidewall portion, and the first sidewall portion is connected to the third sidewall portion. However, to maintain the first and second angles (refer to a1 and a2 in FIGS. 3 and 4), where the first sidewall portion is connected to the second sidewall portion and the first sidewall portion is connected to the third sidewall portion, a connection width of a connection portion between the first and second sidewall portions and between the first and third sidewall portions becomes relatively small. Accordingly, the connection portion between the first and second sidewall portions may become easily disconnected from each other, and the connection portion between the first and third sidewall portions may become easily disconnected from each other.

In contrast, according to one or more exemplary embodiment of the invention where the bottom portion 221-1 is connected to the sidewall portion 221-2 as described above, a connection width between portions of the light source unit 220 becomes relatively wider, and thus the stability and the reliability of the light source unit 220 in conforming to the curved line profile of the display apparatus 1000 may be improved.

Referring to FIG. 4, the light source unit 220 has an unfolded shape (e.g., sidewall portions are disposed in a same plane as the bottom portions). In an exemplary embodiment of a method of manufacturing a backlight unit, the light source unit 220 may be in the unfolded shape before the light source unit 220 is assembled within the backlight unit 220 such as being supported by the bottom chassis 210 and the extrusion bar 230. That is, FIG. 4 shows a top plan view of the light source unit 220 in the third direction DR3 of a plane defined by the first, second and fourth directions DR1, DR2 and DR4.

In an exemplary embodiment of a method of manufacturing a backlight unit, the light source unit 220 may be originally provided in the planar shape as shown in FIG. 4. The light source unit 220 is disposed in the original planar shape thereof in the backlight unit 200. From the original planar shape, the first sidewall portion 221-2a is bent with respect to a bending axis lengthwise extended in the first direction DR1. The second sidewall portion 221-2b is bent with respect to a bending axis lengthwise extended in the second direction DR2. The third sidewall portion 221-2c is bent with respect to a bending axis lengthwise extended in the fourth direction DR4. To provide the bending capability of the circuit board 211 described above, the circuit board 221 may include a flexible material, e.g., aluminum, which is relatively easily bent or deformed.

As described above, the first bottom portion 221-1a and the first sidewall portion 221-2a lengthwise extend in the first direction DR1. The second bottom portion 221-1b and the second sidewall portion 221-2b lengthwise extend in the second direction DR2. The third bottom portion 221-1c and the third sidewall portion 221-2c lengthwise extend in the fourth direction DR4. In an exemplary embodiment of a method of manufacturing a backlight unit where the circuit board 221 is manufactured in plurality by separating each individual circuit board 221 from a plate-shaped base member, a cutting surface or edge of the sidewall portion 221-2 is engaged with a cutting surface or edge of the bottom portion 221-1. Thus, an amount of a base material that may be disposed between individual sidewall and bottom portions and wasted in production may be reduced, and the manufacturing process may be simplified.

Figure 5:
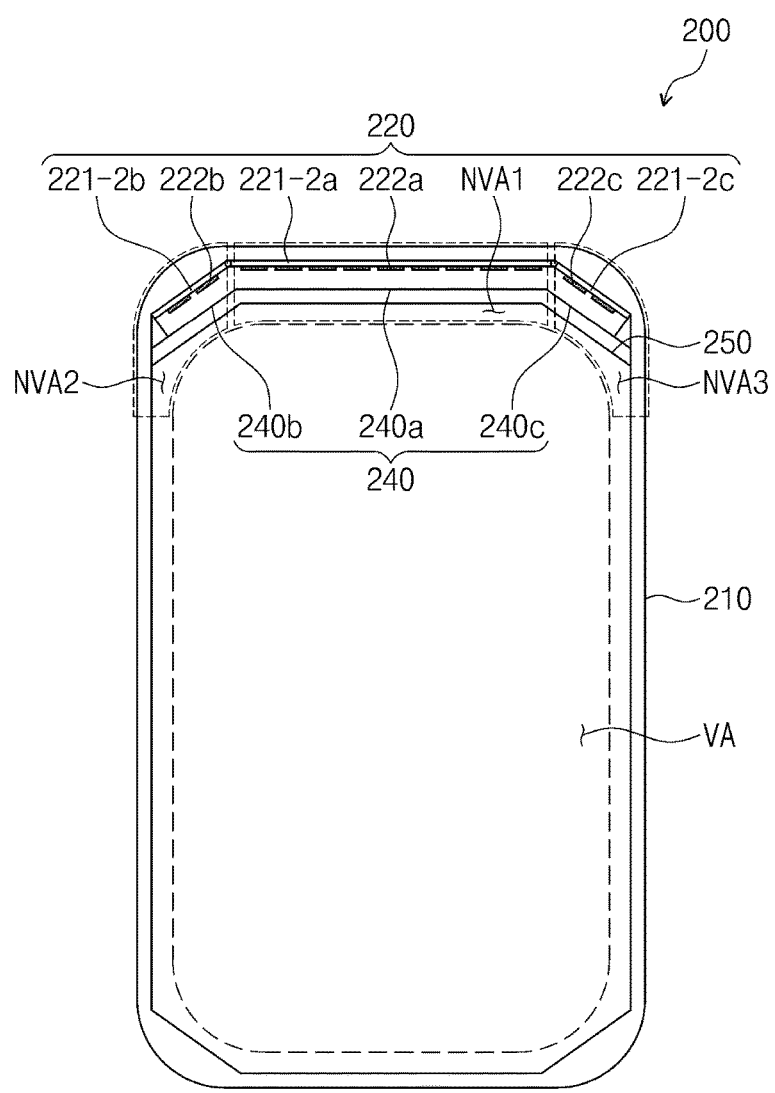
FIG. 5 is a top plan view showing an exemplary embodiment of a backlight unit according to the invention.

FIG. 5 is a top plan view showing an exemplary embodiment of the backlight unit 200 in which the light source unit 220 having the shape shown in FIG. 3 is accommodated according to the invention. FIG. 5 shows a top plan view of the backlight unit 200 in the third direction DR3 of a plane defined by the first, second and fourth directions DR1, DR2 and DR4.

Referring to FIG. 5, the light source unit 220 is accommodated at one side portion of the bottom chassis 210. The sidewall 210b of the bottom chassis 210 supports the first sidewall 221-2a, the second sidewall 221-2b and the third sidewall 221-2c of the light source unit 220 thereon. The inner boundary (dotted line) of the display area VA of the display panel 100 is indicated in FIG. 5 for reference.

The light guide plate 240 includes a first (light) incident surface 240a, a second (light) incident surface 240b and a third (light) incident surface 240c. The light emitted from the first light source 222a is incident to the first incident surface 240a. The first incident surface 240a lengthwise extends in the first direction DR1 to receive the light provided from the first light source 222a. The light emitted from the second light source 222b is incident to the second incident surface 240b. The second incident surface 240b lengthwise extends in the second direction DR2 to receive the light provided from the second light source 222b. The light emitted from the third light source 222c is incident to the third incident surface 240c. The third incident surface 240c lengthwise extends in the fourth direction DR4 to receive the light provided from the third light source 222c.

The optical sheet 250 may be placed to correspond to the accommodating space of the bottom chassis 210. In the top plan view, the optical sheet 250 may include edges thereof disposed to correspond to the overall shape or profile formed by the first, second and third sidewall portions 221-2a, 221-2b and 221-2c.

The display panel 100 disposed above the backlight unit 200 in the third direction DR3 includes the display area VA and the non-display area NVA as described above. The light source unit 220 is overlapped with the non-display area NVA in the top plan view. As the display apparatus 1000 shown in FIG. 1, a portion of the outer boundary of the display panel 100 may have the curved line, and a portion of the inner boundary between the display area VA and the non-display area NVA may have the curved line.

Referring to FIG. 5, in the vicinity of the light source unit 220, the non-display area NVA collectively includes a first (non-display) area NVA1, a second (non-display) area NVA2 and a third (non-display) area NVA3. The first area NVA1 lengthwise extends in the first direction DR1. A boundary between the first area NVA1 and the display area VA has a straight line shape lengthwise extended in the first direction DR1. The second area NVA2 makes contact with a first end of the first area NVA1, and the third area NVA3 makes contact with a second end of the first area NVA1 opposite to the first end in the first direction DR1. A boundary between the second area NVA2 and the display area VA has a curved line shape. A boundary between the third area NVA3 and the display area VA has a curved line shape. Each of these curved line shapes extends from the ends of the first area NVA1, to linear extended portions of the overall non-display area NVA (e.g., at long sides of the display apparatus 1000).

The first sidewall portion 221-2a is overlapped with the first area NVA1 in the top plan view. In an exemplary embodiment, for instance, the entire planar area of the first sidewall portion 221-2a may be overlapped with the first area NVA1 in the top plan view as shown in FIG. 5. In an alternative exemplary embodiment different from FIG. 5, a portion of a planar area of the first sidewall portion 221-2a is overlapped with the first area NVA1 in the top a plan view, and a remaining portion of the first sidewall portion 221-2a is overlapped with the second area NVA2 or the third area NVA3 in the top a plan view.

The second sidewall portion 221-2b is overlapped with the second area NVA2 in the top plan view. In an exemplary embodiment, for instance, as shown in FIG. 5, a portion of the second sidewall portion 221-2b is overlapped with the second area NVA2 in the top plan view, and a remaining portion of the second sidewall portion 221-2b is overlapped with the first area NVA1 in the top plan view. In an alternative exemplary embodiment different from FIG. 5, the entire area of the second sidewall portion 221-2b may be overlapped only with the second area NVA2 when viewed in the top plan view.

The third sidewall portion 221-2c is overlapped with the third area NVA3 in the top plan view. In an exemplary embodiment, for instance, as shown in FIG. 5, a portion of the third sidewall portion 221-2c is overlapped with the third area NVA3 in the top plan view, and a remaining portion of the third sidewall portion 221-2c is overlapped with the first area NVA1 in the top plan view. In an alternative exemplary embodiment different from FIG. 5, the entire area of the third sidewall portion 221-2c may be overlapped with only the third area NVA3 in the top plan view.

The second sidewall portion 221-2b and the third sidewall portion 221-2c having light source mounted thereon allow the light from the light sources to reach the display area VA having the curved boundary in the vicinity of the light source unit 220. Accordingly, the second sidewall portion 221-2b and the third sidewall portion 221-2c allow the light to be provided to the display area VA in contrast to light not being provided by using only the first sidewall portion 221-2a when the backlight unit 200 and/or the display apparatus 1000 has the curved line boundaries.

Figure 6:
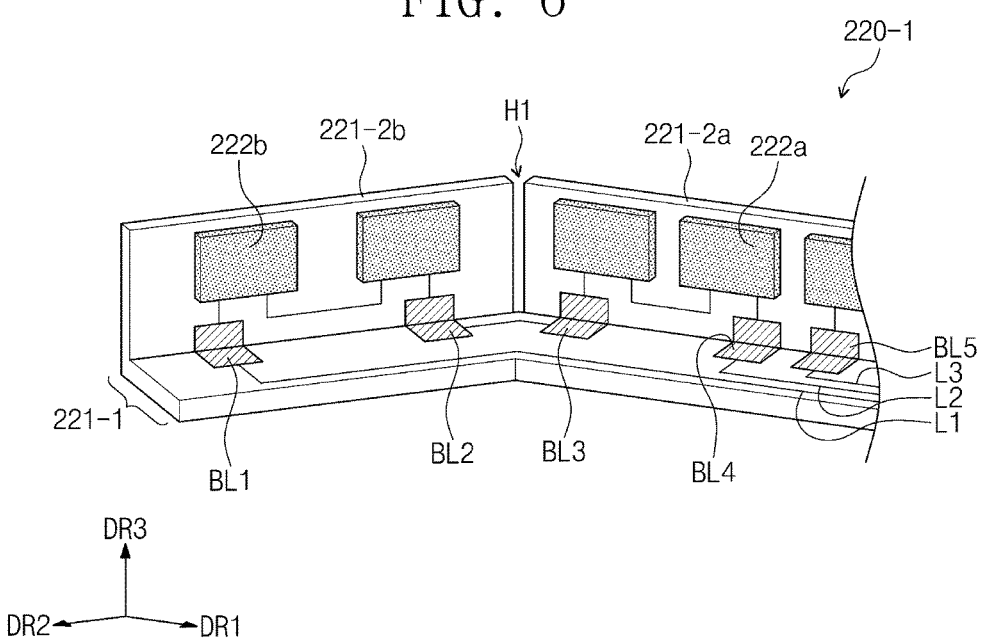
FIGS. 6 and 7 are perspective views showing exemplary embodiments of wiring lines of a light source unit of a backlight unit according to the invention.
Figure 7:
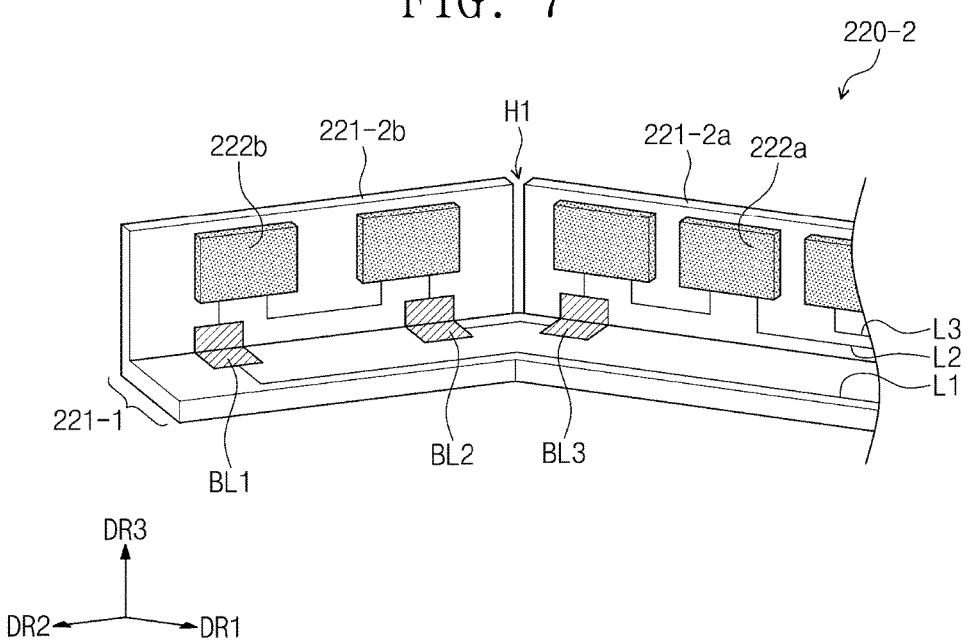

FIG. 6 is a perspective view showing an exemplary embodiment of wiring lines of a light source unit 220-1 according to the invention, and FIG. 7 is a perspective view showing an exemplary embodiment of wiring lines of a light source unit 220-2 according to the invention.

For the convenience of explanation, each of the light source unit 220-1 shown in FIG. 6 and the light source unit 220-2 shown in FIG. 7 has a structure in which four light sources are connected to each other in series, but the number of the light sources and the structure of the light source units 220-1 and 220-2 should not be limited thereto or thereby. In addition, the light sources of each of the light sources units 2201-1 and 220-2 are electrically connected to each other by the wiring line, but the light sources may be electrically connected to each other by various patterns formed in and/or on the first sidewall portion 221-2a and the second sidewall portion 221-2b.

Referring to FIG. 6, the light source unit 220-1 includes first, second and third wiring lines L1, L2 and L3 and first, second, third, fourth and fifth bending wiring lines BL1, BL2, BL3, BL4 and BL5. The wiring lines and the bending wiring lines may transmit control signals and/or power signals therethrough and to the light sources of the light source unit 220-1.

The first wiring line L1 is electrically connected to the second light source 222b, and the second and third wiring lines L2 and L3 are electrically connected to the first light source 222a. Each of the first to third wiring lines L1 to L3 defines a length thereof which is larger than a width thereof. Referring to FIG. 6, for example, the first wiring line L1 defines a length extended in the first direction DR1, the length further extended in the second direction DR2 and then extended from the bottom portion 221-1 toward the second sidewall portion 221-2b. Widths of the first wiring line L1 are taken perpendicular to the length thereof at a particular point along the first wiring line L1. Portions of the first to third wiring lines L1 to L3 are disposed on the bottom portion 221-1. Since the portions of the first to third wiring lines L1 to L3 are disposed on the bottom portion 221-1, the wiring lines may be arranged in an area relatively wider than that when the wiring lines are disposed only on the sidewall portion 2212. In addition, since the wiring lines disposed on the bottom portion 221-1 which already has the bent configuration in the top plan view are not affected by tension due to bending of the light source unit 220-1 into the top plan view shape, the wiring lines are not disconnected even though the bending occurs. Although the planar area of the bottom portion 221-1 increases to easily dispose the first to third lines L1 to L3 thereon, a thickness of the display apparatus 1000 in the third direction DR3 does not increase, and thus the light source unit 220-1 has advantages in terms of slimness in the third direction DR3 of the light source unit 220-1.

The first and second bending wiring lines BL1 and BL2 are partially overlapped with the intersection line, e.g., the extended second corner, at which the bottom portion 221-1 intersects with the second sidewall portion 221-2b. Portions of the first and second bending wiring lines BL1 and BL2 are disposed on the bottom portion 221-1, and remaining portions of the first and second bending wiring lines BL1 and BL2 are disposed on the second sidewall portion 221-2b. The third to fifth bending wiring lines BL3 to BL5 are partially overlapped with the intersection line, e.g., the extended first corner, at which the bottom portion 221-1 intersects with the first sidewall portion 221-2a. Portions of the third to fifth bending wiring lines BL3 to BL5 are disposed on the bottom portion 221-1, and remaining portions of the third to fifth bending wiring lines BL3 to BL5 are disposed on the first sidewall portion 221-2a.

Referring to FIG. 6, other wiring lines may be disposed on respective sidewall portions such as between the light sources thereof and/or between light sources and the bending wiring lines. Still further wiring lines may be disposed on the bottom portion between bending wiring lines.

The first to fifth bending wiring lines BL1 to BL5 are affected by the bending of the first sidewall portion 221-2a or the bending of the second sidewall portion 221-2b, such as in deforming the circuit board 221 in a method of manufacturing a backlight unit. The tension caused by the bending between the first sidewall portion 221-2a and the bottom portion 221-1 acts on the first and second bending wiring lines BL1 and BL2. The tension caused by the bending between the second sidewall portion 221-2b and the bottom portion 221-1 acts on the third to fifth bending wiring lines BL3 to BL5.

Each of the first to fifth bending wiring lines BL1 to BL5 defines a length thereof extended from a respective sidewall portion to a respective bottom portion. The first to fifth bending wiring lines BL1 to BL5 may have a wiring line width taken perpendicular to the length thereof which is greater than that of the first to third wiring lines L1 to L3. Accordingly, where the first sidewall portion 221-2a and the second sidewall portion 221-2b are bent from a flat or extended shape thereof during a method of manufacturing a backlight unit, a crack generated in the first to fifth bending wiring lines BL1 to BL5 may be reduced.

In a conventional light source unit where the first sidewall portion is connected to the second sidewall portion without the bottom portion, the light source unit is bent with respect to a short side of the first sidewall portion and the second sidewall portion. However, in one or more exemplary embodiment of the invention, since the light source unit 220-1 is bent with respect to a relatively long side of the first sidewall portion 221-2a and the second sidewall portion 221-2b, the wiring line width of the first to fifth bending wiring lines BL1 to BL5 may be formed to have relatively large wiring line width.

Referring to FIG. 7, the light source unit 220-2 includes first, second and third wiring lines L1, L2 and L3 and first, second and third bending wiring lines BL1, BL2 and BL3.

A portion of the first wiring line L1 is disposed on the bottom portion 221-1, and the second and third wiring lines L2 and L3 are disposed on the first sidewall portion 221-2a. The first and second bending wiring lines BL1 and BL2 are partially overlapped with the intersection line, e.g., the extended second corner, at which the bottom portion 221-1 intersects with the second sidewall portion 221-2b. The third bending wiring line BL3 is partially overlapped with the intersection line, e.g., the extended first corner, at which the bottom portion 221-1 intersects with the first sidewall portion 221-2a. The first to third bending wiring lines BL1 to BL3 may have a wiring line width greater than that of the first to third lines L1 to L3. Accordingly, where the first sidewall portion 221-2a and the second sidewall portion 221-2b are bent, such as in deforming the circuit board 221 in a method of manufacturing a backlight unit, a crack generated in the first to third bending wiring lines BL1 to BL3 may be reduced.

The number of the bending wiring lines of the light source unit 220_2 is smaller than the number of the bending wiring lines of the light source unit 220_1 shown in FIG. 6. As the number of bending wiring lines decreases line disconnection caused by the crack may be reduced. The number of the wiring lines disposed on the first sidewall portion 221-2a of the light source unit 220-2 shown in FIG. 7 is greater than the number of the wiring lines disposed on the first sidewall portion 221-2a of the light source unit 220-1 shown in FIG. 6. As the number of wiring lines on the sidewall portion increases, a height in a thickness direction (e.g., in the third direction DR3) of the first sidewall portion increases, and an overall thickness of the display apparatus 1000 increases.

Figure 8:
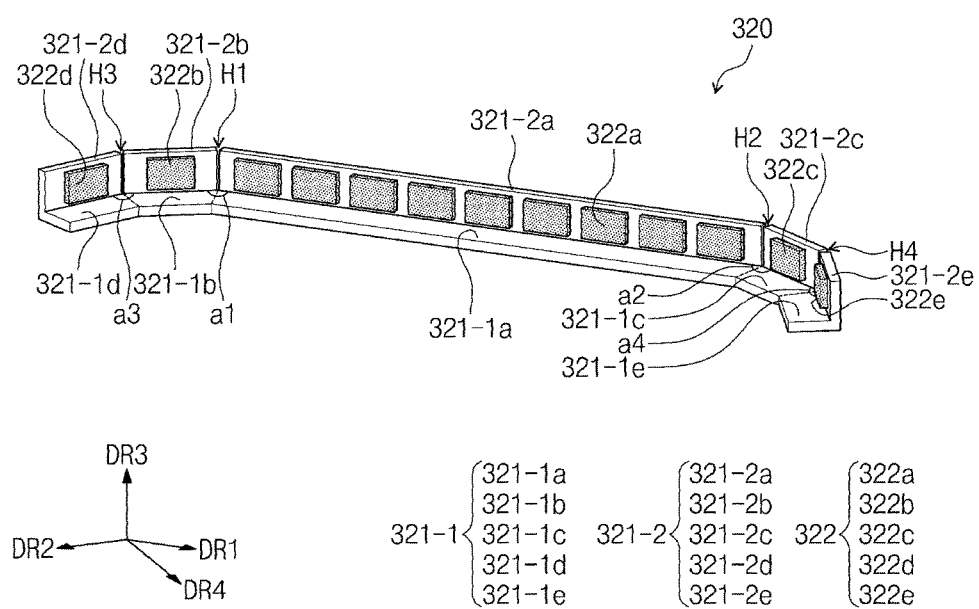
FIG. 8 is a perspective view showing another exemplary embodiment of a light source unit of a backlight unit according to the invention.

FIG. 8 is a perspective view showing another exemplary embodiment of a light source unit 320 according to the invention. The light source unit 220 included in the display apparatus 1000 shown in FIG. 1 or in the backlight unit 200 shown in FIG. 2 may be replaced with the light source unit 320 shown in FIG. 8.

Referring to FIG. 8, the light source unit 320 includes first, second, third, fourth and fifth bottom portions 321-1a, 321-1b, 321-1c, 321-1d and 321-1e (collectively 321-1), first, second, third, fourth and fifth sidewall portions 321-2a, 321-2b, 321-2c, 321-2d and 321-2e (collectively 321-2), and first, second, third, fourth and fifth light sources 322a, 322b, 322c, 322d and 322e (collectively 322).

A first side portion or surface of the first bottom portion 321-1a is connected to a side portion (or surface) of the second bottom portion 321-1b, and a second side portion (or surface) of the first bottom portion 321-1a opposite to the first side portion thereof is connected to a side portion (or surface) of the third bottom portion 321-1c. The other side portion of the second bottom portion 321-1b is connected to a side portion of the fourth bottom portion 321-1d. The other side portion of the third bottom portion 321-1c is connected to a side portion of the fifth bottom portion 321-1e. The first to fifth bottom portions 321-1a to 321-1e are disposed in a same plane as each other, such as that defined by the first, second and fourth directions DR1, DR2 and DR4.

In the top plan view, a length extension direction of the first bottom portion 321-1a and a length extension direction of the second bottom portion 321-1b form a first angle a1.

The length extension direction of the first bottom portion 321-1a and a length extension direction of the third bottom portion 321-1c form a second angle a2. The length extension direction of the second bottom portion 321-1b and a length extension direction of the fourth bottom portion 321-1d form a third angle a3. The length extension direction of the third bottom portion 321-1c and a length extension direction of the fifth bottom portion 321-1e form a fourth angle a4. The first angle a1 may be equal to the second angle a2, and the third angle a3 may be equal to the fourth angle a4.

The length extension directions of the first, second and third bottom portions 321-1a, 321-1b and 321-1c may be disposed in the first, second and fourth directions DR1, DR2 and DR4, while the length extension directions of the fourth and fifth bottom portions 321-1d and 321-1e are disposed in directions different from those of the first, second and fourth directions DR1, DR2 and DR4, such as being disposed at fifth and sixth directions.

The first sidewall portion 321-2a extends in the third direction DR3 from the first bottom portion 321-1a. The second sidewall portion 321-2b extends in the third direction DR3 from the second bottom portion 321-1b. The third sidewall portion 321-2c extends in the third direction DR3 from the third bottom portion 321-1c. The fourth sidewall portion 321-2d extends in the third direction DR3 from the fourth bottom portion 321-1d. The fifth sidewall portion 321-2e extends in the third direction DR3 from the fifth bottom portion 321-1e.

With the respective sidewall portions extended from a respective bottom portion as described above, a first slit H1 is provided between the first sidewall portion 321-2a and the second sidewall portion 321-2b. Similarly, a second slit H2 is provided between the first sidewall portion 321-2a and the third sidewall portion 321-2c. A third slit H3 is provided between the second sidewall portion 321-2b and the fourth sidewall portion 321-2d. A fourth slit H4 is provided between the third sidewall portion 321-2c and the fifth sidewall portion 321-2e. The first to fifth light sources 322a to 322e are respectively mounted on the first to fifth sidewall portions 321-2a to 321-2e. One or more of the first to fifth light sources 322a to 322e may be mounted on an individual respective one of the first to fifth sidewall portions 321-2a to 321-2e.

Since the light source unit 320 further includes the fourth and fifth bottom portions 321-1a and 321-1b, the fourth and fifth sidewall portions 321-2a and 321-2b, and the fourth and fifth light sources 322d and 322e, the light may be effectively provided to the display panel having the curved boundary, and the narrower bezel area may be implemented.

The number of individual bottom portions 321-1 is not limited to those shown in FIG. 8. In an exemplary embodiment, additional bottom portions may further be disposed at the distal end of the fourth bottom portion 321-1d and the distal end of the fifth bottom portion 321-1e, and additional sidewall portions may respectively extend in the third direction DR3 from these additional bottom portions. Thus, additional light sources may be mounted on these additional sidewall portions.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A backlight unit comprising:
    a first light source which generates and emits a first light;
    a second light source which generates and emits a second light; and
    a circuit board on which the first and second light sources are mounted,
    wherein the circuit board comprises:
        a bottom portion comprising in a top plan view,
            a first bottom portion including a first edge extending parallel to a first direction; and
            a second bottom portion including a second edge extending parallel to a second direction crossing the first direction at an obtuse angle,
            wherein the first bottom portion and the second bottom portion are a single body; and
        a sidewall portion extending from the bottom portion, the sidewall portion comprising in a third direction crossing each of the first and second direction:
            a first sidewall portion extending from the first edge of the bottom portion and on which the first light source is mounted; and
            a second sidewall portion extending from the second edge of the bottom portion and on which the second light source is mounted.

2. The backlight unit of claim 1, wherein at a boundary between the first and second edges of the bottom portion, the first sidewall portion and the second sidewall portion are separated from each other.

3. The backlight unit of claim 2, wherein
    the third direction is perpendicular to the first and second directions,
    the first sidewall portion extends in the third direction from the first edge of the bottom portion to form a first corner in cross-section, and
    the second sidewall portion extends in the third direction from the second edge of the bottom portion to form a second corner in cross-section.

4. The backlight unit of claim 1, wherein
    the first bottom portion defines a first corner in cross-section with the first sidewall portion extended therefrom, the first corner being extended along the first edge in the top plan view, and
    the second bottom portion defines a second corner in cross-section with the second sidewall portion extended therefrom, the second corner being extended along the second edge in the top plan view.

5. The backlight unit of claim 1, further comprising a third light source which generates and emits a third light;
    wherein
    in the top plan view, the bottom portion further comprises a third bottom portion which extends from the first bottom portion and includes a third edge of the bottom portion extending parallel to a fourth direction crossing each of the first and second directions
    the sidewall portion further comprises a third sidewall portion extending in the third direction from the third edge of the third bottom portion and
    the first bottom portion is disposed between the second bottom portion and third bottom portion.

6. The backlight unit of claim 5, wherein in the top plan view,
    lengths of the first, second and third sidewall portions respectively extend in length extension directions parallel to the first, second and fourth directions crossing each other, and
    an angle between the length extension direction of the first sidewall portion and the second sidewall portion is equal to an angle between the length extension directions of the first sidewall portion and the third sidewall portion.

7. The backlight unit of claim 5, further comprising a fourth light source and a fifth light source which respectively generate and emit a fourth light and a fifth light;
wherein
in the top plan view, the bottom portion further comprises:
a fourth bottom portion which extends from the second bottom portion to dispose the second bottom portion between the first bottom portion and the fourth bottom portion, the fourth bottom portion comprising a fourth edge of the bottom portion, the fourth edge extending parallel to a fifth direction crossing each of the first, second and fourth directions; and
a fifth bottom portion which extends from the third bottom portion to dispose the third bottom portion between the first bottom portion and the fifth bottom portion, the fifth bottom portion comprising a fifth edge of the bottom portion, the fifth edge extending parallel to a sixth direction crossing each of the first, second, fourth and fifth directions, and
the sidewall portion further comprises:
a fourth sidewall portion extending in the third direction from the fourth edge of the fourth bottom portion and on which the fourth light source is mounted; and
a fifth sidewall portion extending in the third direction from the fifth edge of the fifth bottom portion and on which the fifth light source is mounted.

8. The backlight unit of claim 1, further comprising:
a bottom chassis in which the circuit board is accommodated, and
an extrusion bar disposed between the bottom portion and the bottom chassis, the extrusion bar commonly disposed at each of the first and second sidewall portions.

9. The backlight unit of claim 1, further comprising a light guide plate which is accommodated in the bottom chassis, receives the first and second lights,
wherein the light guide plate comprises:
a first incident surface to which the first light emitted from the first light source is incident and which extends in the first direction; and
a second incident surface to which the second light emitted from the second light source is incident and which extends in the second direction from an end of the first incident surface.

10. The backlight unit of claim 1, wherein the circuit board further comprises:
a first wiring line connected to the first light source; and
a second wiring line connected to the second light source,
wherein a portion of the first wiring line and a portion of the second wiring line are disposed on the bottom portion of the circuit board.

11. The backlight unit of claim 10, wherein
the first and second sidewall portions extend in the third direction respectively from the first and second edges of the bottom portion to form first and second corners in cross-section,
the first wiring line comprises a first bending wiring line portion overlapped with the first corner and having a line width greater than a portion of the first wiring line disposed on the bottom portion,
the second wiring line comprises a second bending wiring line portion overlapped with the second corner and having a line width greater than a portion of the second wiring line disposed on the bottom portion.

12. The backlight unit of claim 1, wherein
the first and second sidewall portions extend in the third direction respectively from the first and second edges of the bottom portion to form first and second corners in cross-section, and
the circuit board further comprises:
a first wiring line connected to the first light source and comprising a first portion disposed on the bottom portion and a first bending wiring line portion which is overlapped with the first corner; and
a second wiring line connected to the second light source and comprising a portion disposed on the second sidewall portion,
wherein the first bending wiring line portion has a line width greater than a line width of the portion of the first wiring line disposed on the bottom portion.

13. The backlight unit of claim 12, wherein
the first light source collectively comprises a plurality of first light emitting diodes,
the second light source collectively comprises a plurality of second light emitting diodes, and
a number of the first light emitting diodes mounted on the first sidewall portion is greater than a number of the second light emitting diodes mounted on the second sidewall portion.

14. A display apparatus comprising:
a display panel comprising a display area at which an image is displayed and a non-display area which is disposed adjacent to the display area at which the image is not displayed; and
a backlight unit which generates and provides a light to the display panel, the backlight unit comprising:
a first light source which generates and emits the light;
a second light source which generates and emits the light;
a circuit board on which the first and second light sources are mounted; and
a bottom chassis in which the circuit board is accommodated,
wherein the circuit board comprises:
a bottom portion comprising in a top plan view, a first edge extending parallel to a first direction and a second edge extending parallel to a second direction crossing the first direction at an obtuse angle; and
a sidewall portion extending in a thickness direction of the display apparatus from the bottom portion, the sidewall portion comprises:
a first sidewall portion bent at the first edge of the bottom portion with respect to a bending axis parallel to the first direction and on which the first light source is mounted; and
a second sidewall portion bent at the second edge of the bottom portion with respect to a bending axis parallel to the second direction and on which the second light source is mounted.

15. The display apparatus of claim 14, wherein a portion of an outer boundary of the display panel has a curved line shape in the top plan view.

16. The display apparatus of claim 15, wherein a portion of an inner boundary defined between the display area and the non-display area in the top plan view corresponding to the portion of an outer boundary has a curved line shape in the top plan view.

17. The display apparatus of claim 16, wherein in the top plan view, the circuit board which is accommodated in the bottom chassis overlaps the non-display area and has a shape corresponding to the curved line shape of the inner boundary defined between the display area and the non-display area.

18. The display apparatus of claim 17, wherein the non-display area comprises:
    a first area extending in the first direction; and
    a second area extending from the first area and comprising the inner boundary having the curved line shape between the display area and the non-display area, the first sidewall portion is overlapped with the first area in the top plan view, and the second sidewall portion is overlapped with the second area in the top plan view.

* * * * *